United States Patent
Nelson et al.

(10) Patent No.: US 10,490,542 B2
(45) Date of Patent: Nov. 26, 2019

(54) INTEGRATED CIRCUIT LAYOUT USING LIBRARY CELLS WITH ALTERNATING CONDUCTIVE LINES

(71) Applicant: Intel Corporation, Santa Clara, CA (US)

(72) Inventors: Donald W. Nelson, Beaverton, OR (US); Patrick Morrow, Portland, OR (US); Steven M. Burns, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 15/574,813

(22) PCT Filed: Jun. 24, 2015

(86) PCT No.: PCT/US2015/037417
§ 371 (c)(1),
(2) Date: Nov. 16, 2017

(87) PCT Pub. No.: WO2016/209224
PCT Pub. Date: Dec. 29, 2016

(65) Prior Publication Data
US 2018/0145063 A1  May 24, 2018

(51) Int. Cl.
*H01L 27/02* (2006.01)
*G06F 17/50* (2006.01)
(Continued)

(52) U.S. Cl.
CPC ...... *H01L 27/0207* (2013.01); *G06F 17/5068* (2013.01); *H01L 23/5286* (2013.01);
(Continued)

(58) Field of Classification Search
CPC ............ H01L 27/0207; H01L 23/5286; H01L 27/11807; G06F 17/5068
(Continued)

(56) References Cited

U.S. PATENT DOCUMENTS 6,771,806 B1 * 8/2004 Satya et al. ............ G01N 21/66
324/754.22
7,327,591 B2 * 2/2008 Sadra et al. ........ H01L 27/1104
257/E27.099
(Continued)

OTHER PUBLICATIONS

International Search Report and Written Opinion for International Patent Application No. PCT/US2015/037417 dated Mar. 31, 2016, 14 pgs.
(Continued)

*Primary Examiner* — Sun J Lin
(74) *Attorney, Agent, or Firm* — Schwabe, Williamson & Wyatt P.C.

(57) ABSTRACT

An integrated circuit layout is described that uses a library cells with alternating conducting lines. One embodiment includes a first cell and a second cell, the second cell being adjacent to the first cell. The first cell has a first plurality of conductive lines, a first portion of the first plurality having line ends that are a first distance from the second cell. The second cell has a second plurality of conductive lines, the conductive lines being parallel to and aligned with the conductive lines in the first cell, a second portion of the second plurality having line ends that are a second distance from the first cell. The first distance is shorter than the second distance.

17 Claims, 12 Drawing Sheets

(51) Int. Cl.
*H01L 27/118* (2006.01)
*H01L 23/528* (2006.01)

(52) U.S. Cl.
CPC .......... *H01L 27/11807* (2013.01); *H01L 2027/11875* (2013.01)

(58) Field of Classification Search
USPC .................................. 716/118, 119
See application file for complete search history.

(56) References Cited

U.S. PATENT DOCUMENTS

| | | | |
|---|---|---|---|
| 7,973,371 B2* | 7/2011 | Furuta et al. | G11C 11/4125 257/369 |
| 9,269,702 B2* | 2/2016 | Quandt et al. | H01L 27/0207 |
| 9,690,896 B2* | 6/2017 | Seo et al. | H01L 21/823871 |
| 10,147,684 B1* | 12/2018 | Kuchanuri et al. | G06F 17/5077 |
| 2002/0040985 A1 | 4/2002 | Aldrich | |
| 2006/0289914 A1* | 12/2006 | Juengling et al. | H01L 27/10855 257/296 |
| 2011/0049576 A1 | 3/2011 | Ostermayr et al. | |
| 2011/0084312 A1 | 4/2011 | Quandt | |
| 2013/0026572 A1 | 1/2013 | Kawa et al. | |
| 2013/0313615 A1 | 11/2013 | Tzeng et al. | |
| 2014/0167117 A1 | 6/2014 | Quandt et al. | |
| 2016/0300840 A1* | 10/2016 | Seo et al. | H01L 21/823871 |

OTHER PUBLICATIONS

International Preliminary Report on Patentability for International Patent Application No. PCT/US2015/037417 dated Jan. 4, 2018, 10 pages.
Search Report for European Patent Application No. 15896515.2 dated Feb. 14, 2019, 8 pgs.

* cited by examiner

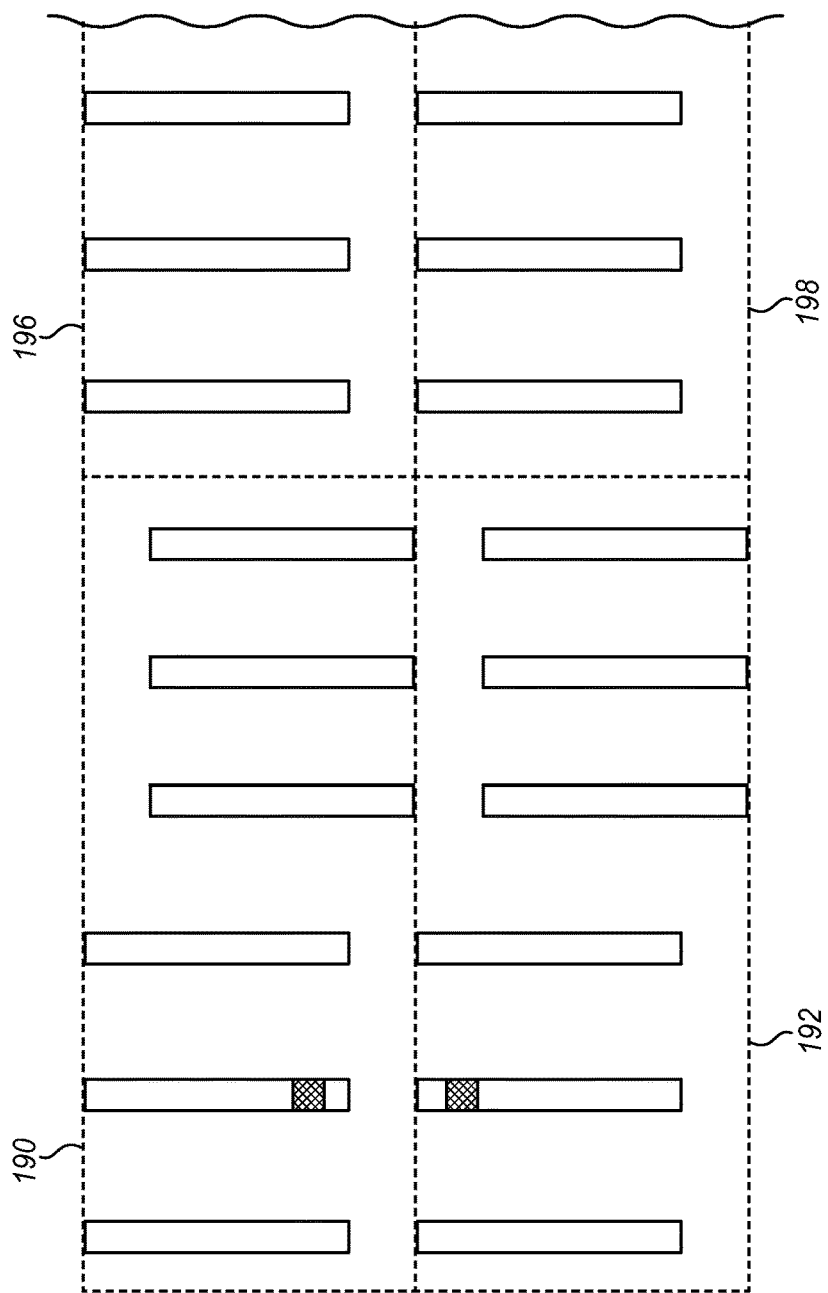
FIG. 6
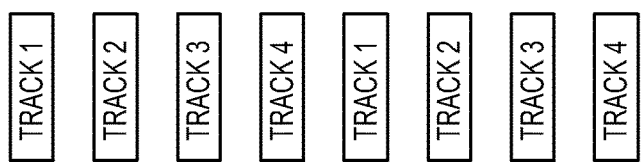

US 10,490,542 B2

INTEGRATED CIRCUIT LAYOUT USING LIBRARY CELLS WITH ALTERNATING CONDUCTIVE LINES

CROSS-REFERENCE TO RELATED APPLICATION

This patent application is a U.S. National Phase Application under 35 U.S.C. § 371 of International Application No. PCT/US2015/037417, filed Jun. 24, 2015, entitled "INTEGRATED CIRCUIT LAYOUT USING LIBRARY CELLS WITH ALTERNATING CONDUCTIVE LINES," which designates the United States of America, the entire disclosure of which is hereby incorporated by reference in its entirety and for all purposes.

FIELD

The present description relates to integrated circuit layout using a library and in particular to library cells with alternating conductive lines.

BACKGROUND

Integrated circuits are typically designed using a library of cells. Each cell has a the circuitry for a commonly used component such as a logic device, a flip-flop, a latch, a comparator, an arithmetic unit, a buffer or set of memory registers, a delay gate, or another component. The cells are arranged and ordered on the silicon and then connected together in order to design the desired circuits. The cells may be limited to very simple devices, such as buffers and logic gates or more complex devices such as multipliers and memory arrays, depending on the library.

Each cell in a library is designed to fit within common physical and electrical standards so that the circuit designer is able to lay any cell in any desired location to build the desired circuit. Typically a standard cell size unit is used for all of the cells. Some cells are then designed as being double height or double width or both. This allows for more complex components to be combined with simpler components using a single library.

In addition to connections between cells, a cell typically has connections between transistors, diodes, and other components within the cell. These interior connections may be made using metal lines formed over the transistors, diodes, and any other components formed on the silicon substrate of the integrated circuit. The metal lines are formed in layers that may be named M1, M2, M3, etc., depending on the library. The metal lines are designed so that they are in parallel tracks between dielectric lines. This make the circuit easier to fabricate and it makes it easier to connect cells together because the connection points will also be on the parallel tracks.

Advanced process design rules require a specified cut spacing, that is a gap or distance, between the ends of any two metal lines on the same track. The design rules may also require a minimum distance between a via and a non-related line. When vias or metal line ends occur at the top or bottom of a standard cell design, the design rules require that the vias are some distance from the edge and that the metal lines end some distance before the edge of the cell. In this way, if another cell is placed directly above or below and if this cell also has metal lines in the same tracks, then the line ends between the two cells will be spaced sufficiently from each other. The design rules ensure electrical performance near the cell boundaries of two different cells.

BRIEF DESCRIPTION OF THE DRAWINGS

Embodiments are illustrated by way of example, and not by way of limitation, in the figures of the accompanying drawings in which like reference numerals refer to similar elements.

FIG. 6 is a simplified top view diagram of interconnect layers of adjacent cells of a fifth alternative integrated circuit design layout according to an embodiment.

DETAILED DESCRIPTION

Figure 1:
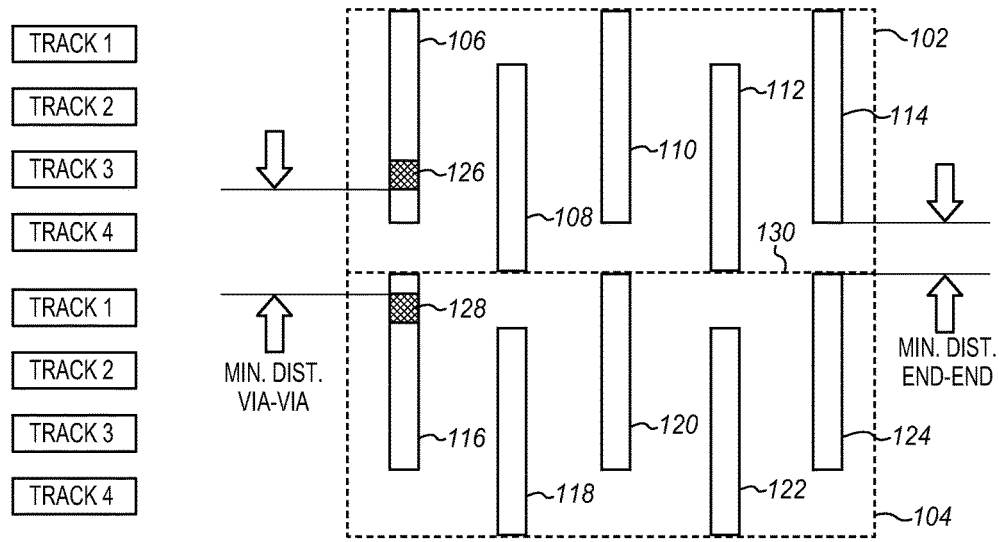
FIG. 1 is a simplified top view diagram of interconnect layers of adjacent cells of an integrated circuit design layout according to an embodiment.

By alternating the minimum distance from end of each metal line to the edge of the cell between tracks, every other line may be made closer to the edge of the cell. This may be combined with placement rules to allow end to end and via to via distances in the design rules to be fully met while still keeping the cell library as short as possible. The alternating distance allows cells to be made smaller which allows more cells and more devices to be contained in less space. The shorter cells enable a smaller die or chip in the final integrated circuit design.

Some libraries have design rules for placing the metal lines for power and ground on the cell boundaries. This allows the power and ground connections to easily be shared between neighboring cells. However, in order to satisfy the rules for distances between metal lines and cell boundaries, the power and ground are pulled inboard from the top and bottom cell boundaries. This increases the cell height, the vertical length as viewed as a layout from the top.

The design rules for cut spacing or gap distance are also applied to the ends of polysilicon areas, used for example for transistor gates and to the ends of source and drain areas in transistors including tri-gate transistors. When these types of ends occur close to a cell boundary, then the distance must also be maintained from similar structures in a cell that is placed above or below the existing cell. Rather than provide multiple cell designs for different placement options, the ends are limited in how close such ends can come to the upper and lower cell boundaries.

As described herein the ends of the metal lines of a cell are crenellated within the cell. The crenellations are orthogonal to the top and bottom edges of the cells in the library. Cell placement is used to ensure the ends fit like puzzle pieces. The crenellations alternate the closeness of the line ends to the top and bottoms of the cells. This allows the cell library height to be significantly decreased. Decreasing the area required for the cells in the library will generally improve the cost-per-transistor numbers.

For cells with alternating polysilicon and source or drain lines, the same crenellation approach may be used. The metal source and drain lines may be made closer to the edge than that polysilicon lines. This permits forming contacts on the ends of the metal lines and connections to metal interconnections above the poly and gate routing The polysilicon lines may be crenellated independent of any other lines. The gate materials may be crenellated independent of any other lines or the combination polysilicon and gate lines may be crenellated together. The crenels may correspond to either the polysilicon or the gate depending on how the external connections are to be made.

A variety of different crenellation styles are described herein. Some styles provide higher cell density, that is they allow the cells to be made smaller. Some styles improve the access between the top and bottom horizontal metals. A cell library may be based on one type or the other. Alternatively both types could be used in a single cell library. The placement of the cells will be more difficult. However, the resulting design may be more compact.

FIG. 1 is a simplified top view diagram of conductive lines of two adjacent cells where the lines are crenellated. The diagram is a very small portion of an integrated circuit layout. There is a first cell 102 over a second cell 104. The first cell is above the second cell as shown on the page and but for the integrated circuit the two cells are at the same vertical level in this top view. The direction toward the first cell will be referred to as up and the direction toward the second cell will be referred to as down. The cells are vertically aligned end-to-end and are each four tracks high and five tracks wide. The horizontal tracks or rows are labeled track 1, track 2, track 3, and track 4 on the left side down the page for each cell. The vertical tracks or columns are not labeled but each corresponds to a conductive line as described below. The horizontal tracks are parallel to each other and the vertical tracks are parallel to each other so that the design rules define a grid.

Figure 13:
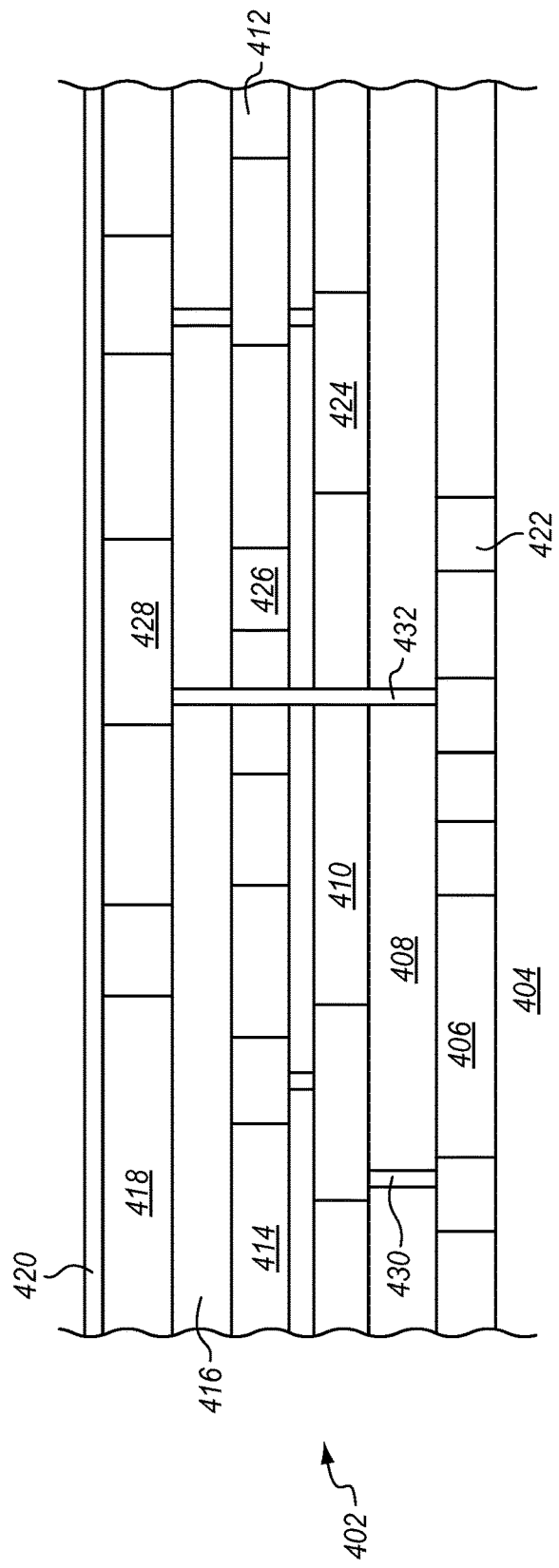
FIG. 13 is a side-cross-sectional view of a portion of an integrated circuit with metal lines and polysilicon according to an embodiment.

As described herein vertical refers to the direction that is parallel to the conductive lines and horizontal refers to the direction that is parallel to the tracks. This is a convention commonly used for cell layout, but does not refer to the position that the corresponding structures will have in the eventual integrated circuit. The devices shown here are for a planar structure, although embodiments are not so limited, so that in operation, both directions will be parallel to the device substrate as shown in FIG. 13.

In the top cell, there are five conductive lines 106, 108, 110, 112, 114 from left to right, each in a respective one of the vertical tracks. The bottom cell similarly has five conductive lines 116, 118, 120, 122, 124 from left to right. All of the conductive lines are aligned with the vertical tracks. The size, positioning and alignment of the tracks in both directions simplifies production of the resulting integrated circuit. The conductive lines may be formed of any of a variety of metals or other conductive materials, such as conductive oxides, conductive nitrides, and ceramics. The lines will be referred to as metal lines for simplicity, however, any other conductive material may be used.

The upper left line 106 for the two cells has a via 126. The via allows the metal line to be coupled to another line or other connection either above or below the upper left line 106. Similarly the bottom left line 116 has a via 128 to connect it to some other component above or below that line.

The first 102 and second 104 cells are adjacent and the bottom border of the first cell and the top border of the second cell are adjacent and share a common boundary 130. The metal lines are horizontally aligned so that the left most line 106 of the first cell is directly above the left most line 116 of the bottom cell. These metal lines are staggered or crenellated so that the end of the line of the bottom cell rises all the way up to the edge 130 of the two cells. The end of the upper line 106 however is spaced away from the edge. In terms of the four vertical tracks, the line of the bottom cell covers track 1 of the bottom cell. The line of the top cell does not cover track 4 of the top cell but stops at track 3. This difference is to maintain a minimum end-to-end distance between metal lines on the same track in adjacent cells.

Considering the vias 126, 128 in the left most lines 106, 116, there is also a minimum distance between vias in the same or adjacent cells. This minimum distance like the minimum distance between metal lines is a part of the design rules in order to maintain the electrical integrity of the circuits when they are laid out over the substrate. While the left most line in the top cell may be able to extend past track 3, depending upon the sizes of the tracks and the minimum end-to-end distance, the via cannot. As a result, this via is not able to connect to any components through track 4 at the edge of the cell. On the bottom cell 104, however, the via 128 is able to connect to track 1 near the edge of the cell.

The second metal lines 108, 118 are similarly vertically aligned in the same way as the left-most metal lines 106, 116. The second metal lines are parallel to each other and extend along the parallel vertical tracks. However, the second two lines are vertically staggered. The vertical positions alternate or are crenellated. The left most line 106 of the top cell 102 does not reach to the edge 130 of the cell but only to a little past track 3. However, the end of the next line 108 extends down to and abuts the edge 130 of the cell. In order not to violate the end-to-end distance limits, however, the second metal line 118 of the second cell 104 is lowered. This line unlike the line to its left does not touch the edge of the cell but ends near track 2 below the edge of the cell. The distance below the edge is at least as much as the minimum end-to-end distance but may be more, depending on the circuit design for the cell.

This pattern is repeated. In the illustrated example, the metal lines are all the same length and alternate in position so that the odd-numbered lines, i.e. the first, third, and fifth metal lines are vertically aligned with each other. Similarly the even-numbered lines, i.e. the second and fourth metal lines are aligned with each other. In these crenallations, the odd lines are raised away from the edge in the top cell while the even numbered lines are lowered to reach the edge of the top cell. In the second or bottom cell 104, the positions are reversed so that the odd numbered lines are raised and the even numbered lines are lowered. This provides an interlocking, complementary alternation in position that allows both cells to have lines that reach their edges.

In the example of FIG. 1, all of the metal lines have the same length. The configuration of the metal lines in both cells 102, 104 is identical. The odd-numbered lines of both cells are pushed up and the even numbered lines of both cells are pushed down. This allows the minimum end-to-end distance to be maintained. The two cells have exactly the same pattern of metal lines and additional cells may be added above and below the two cells shown in the same way to maintain the same pattern. Additional cells with this configuration may also be added to the left and right of those illustrated and the same pattern is still maintained. The principles shown here may be applied to cells with more than five vertical tracks across and more than four horizontal tracks. The alternating pattern may be used in the same way with smaller or larger cells.

Figure 2:
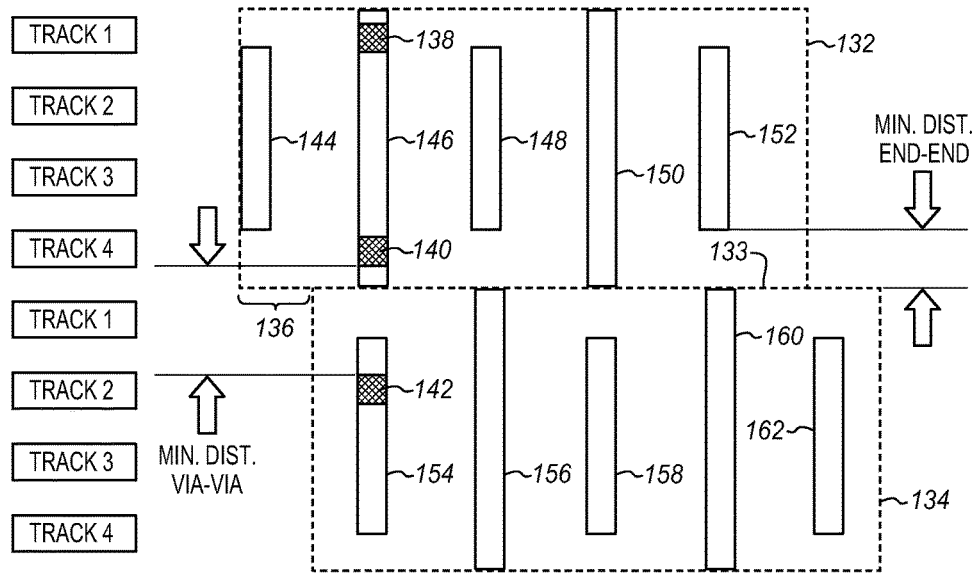
FIG. 2 is a simplified top view diagram of interconnect layers of adjacent cells of an alternative integrated circuit design layout according to an embodiment.

FIG. 2 is a simplified top view diagram of two cells in an alternative configuration. A first top cell 132 is over a second bottom cell 134, however, the top cell is offset by a distance 136 that corresponds to one vertical track. As a result a left most metal line 144 is not aligned with any metal lines of the bottom cell. It may or may not be aligned with lines of a third cell (not shown) in the layout. The second line 146 to the left of the top cell 146 is aligned end-to-end with a left most line 152 of the bottom cell 134. While the first cell is horizontally offset from the second cell, since it is offset by one track, the metal lines are aligned. However, the even numbered lines of the top cell are aligned with the odd numbered lines of the bottom cell.

Considering the first cell, the metal lines are crenellated so that they alternate in distance from the shared edge 133, the bottom edge of the top cell, and the top edge of the bottom cell. The first, third and fifth metal lines 144, 148, 152 are spaced apart from the edge and the bottom ends are raised up from the bottom edge. On the other hand the second and fourth metal lines 146, 150 extend all the way down to the common edge 133 between the two cells. In the second cell 134 below the first cell, the same pattern occurs. The first, third and fifth 154, 158, 162 are spaced from the common top edge of the second cell, while the even numbered metal lines, the second and the fourth lines 156, 160 extend all the way to the edge. Due to the offset 136 between the top and bottom cell the even numbered metal lines of the top cell are in the same vertical track as the odd numbered metal lines of the second cell. As a result the alternating short long configuration at the common boundary of the two cells is maintained.

In many libraries, any cell may be placed either right side up or upside down. In order to make connections more convenient and more direct any cell may be inverted or rotated 180°. The inversion of the cell also maintains all of the metal lines in the vertical tracks. Rotations of a quarter circle or 90° are typically not permitted because it would violate the vertical tracks. Vertical metal lines would become horizontal metal lines. This provides a great convenience in laying out circuits and reduces the lengths of the connections.

In the example of FIG. 1, if either the top or the bottom cell were to be inverted, then the alternating pattern at the edge would be reversed. If the top cell were inverted or turned upside down, then the left most metal line would be the present right side line 114 and the top edge of the cell would be the bottom edge of the cell. Since the right side line 114 comes to the top edge of the cell, if the cell were inverted then this line would then come to the shared edge 130 between the cells on the left-most track. This would then violate the distance from the left side line 116 of the bottom cell. The same violation would occur for the third and fifth lines, while the second and fourth lines would have double the minimum end-to-end distance.

FIG. 2 presents an alternative approach. Instead of all of the lines being the same length, the odd numbered lines 144, 148, 152, 154, 158, 162 are shorter and the even numbered lines 146, 150, 156, 160 are longer. This is the same in both cells 132, 134. While the cells cannot be aligned horizontally as in FIG. 1 without violating the minimum end-to-end distance, the cells can be aligned with an offset. Any odd-numbered offset may be used. As shown the offset is one track. However, an offset of three or five tracks may be used. For that are more than five tracks wide a larger odd-numbered offset may be used. In addition, due to the alternating long short pattern of the metal lines, either one of the cells may be inverted. The long short alternation will remain the same. In the same way, similar cells may be placed above and below the two cells shown. Provided that an odd numbered offset is used, the alternating pattern will be maintained.

Figure 3:
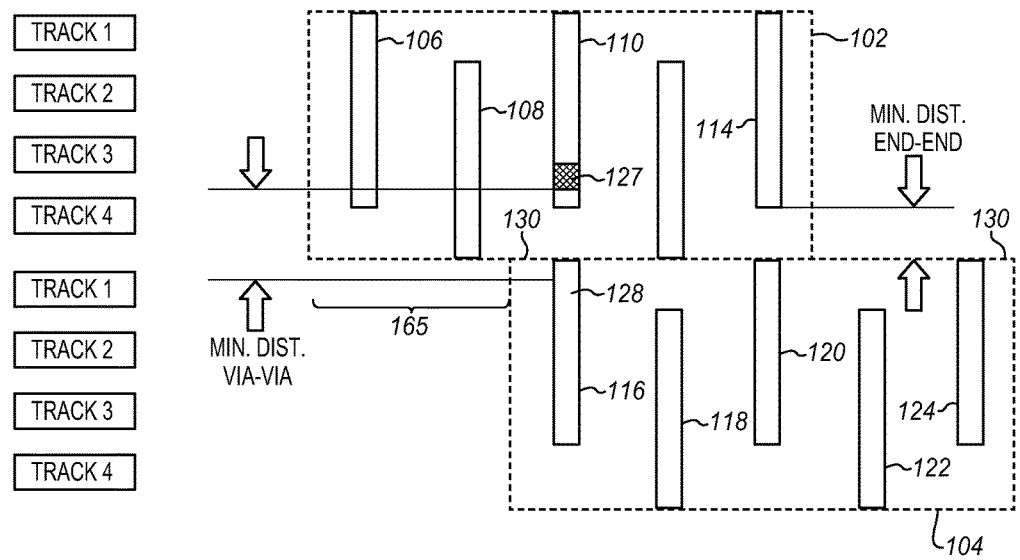
FIG. 3 is a simplified top view diagram of interconnect layers of adjacent cells of a second alternative integrated circuit design layout according to an embodiment.

FIG. 3 is a top view diagram of the two cells of FIG. 1 in an alternate configuration. The first cell 102 is on the top above the second cell 104. In this case, the top cell is offset from the second cell by an offset 165 of two tracks. The alternating positions of equal length metal lines, described above with respect to FIG. 1, allows any even numbered offset to be applied to the cell layout. The minimum end-to-end distance is still maintained.

Two vias are shown similar to those in FIG. 1. The first cell has a via 127 in track 3 and the third via 110. Due to the alternating positions of the vias, the third track is the closest track to the common edge 130 between the cells that is available in the odd numbered metal lines. The via 127 in the third track is in the same tack as the via 126 in the left most via 106. The upper most via 128 in the left most line 116 is in the first track closest to the common edge. The two vias 127, 128 are separated by one track as in FIG. 1 which maintains the minimum via-to-via distance.

Figure 4:
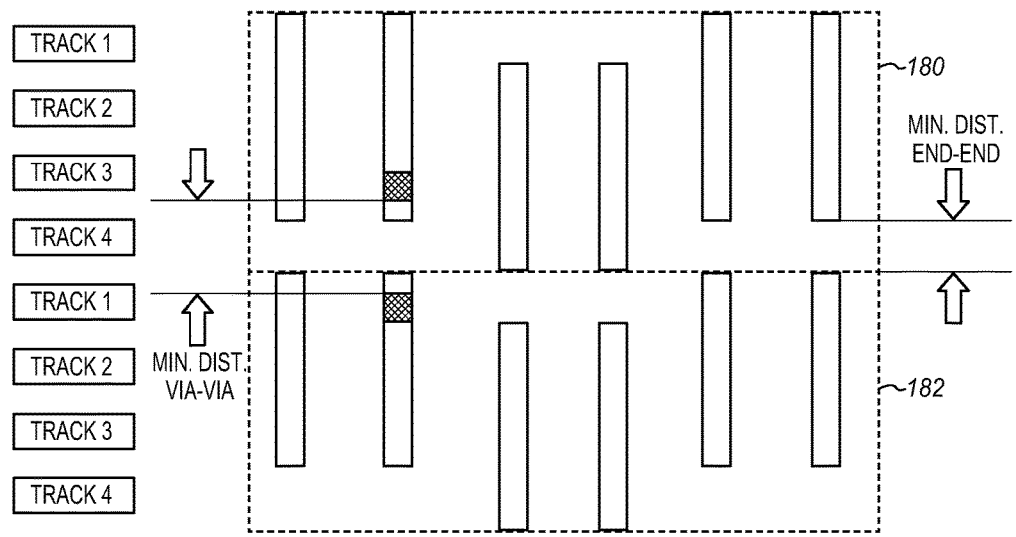
FIG. 4 is a simplified top view diagram of interconnect layers of adjacent cells of a third alternative integrated circuit design layout according to an embodiment.

FIG. 4 is top view diagram of a layout with two different cells. The first cell 180 is four tracks high as in the other examples, although any other desired height may be used. It is six tracks wide and has a pair-wise alternating metal line position pattern. The second cell 182 is below the first cell and is the same size with the same metal line pattern. In both cells, the first two metal lines are raised up. The second two metal lines are lowered and the third two metal lines are raised up like the first two metal lines. As in the example of FIG. 1, because all of the metal lines are the same width, and the two cells are aligned, the spacing is maintained. The left most pair is raised so that the lines of the bottom cell reach the common edge between the two cells and the left most pair of the top cell is raised above the common edge to maintain the minimum end-to-end distance. If the same pattern were extended out to eight vertical tracks instead of six, then the pattern would be evenly repeated from cell to cell. However, with this type of pattern, any number of vertical tracks may be supported.

Figure 5:
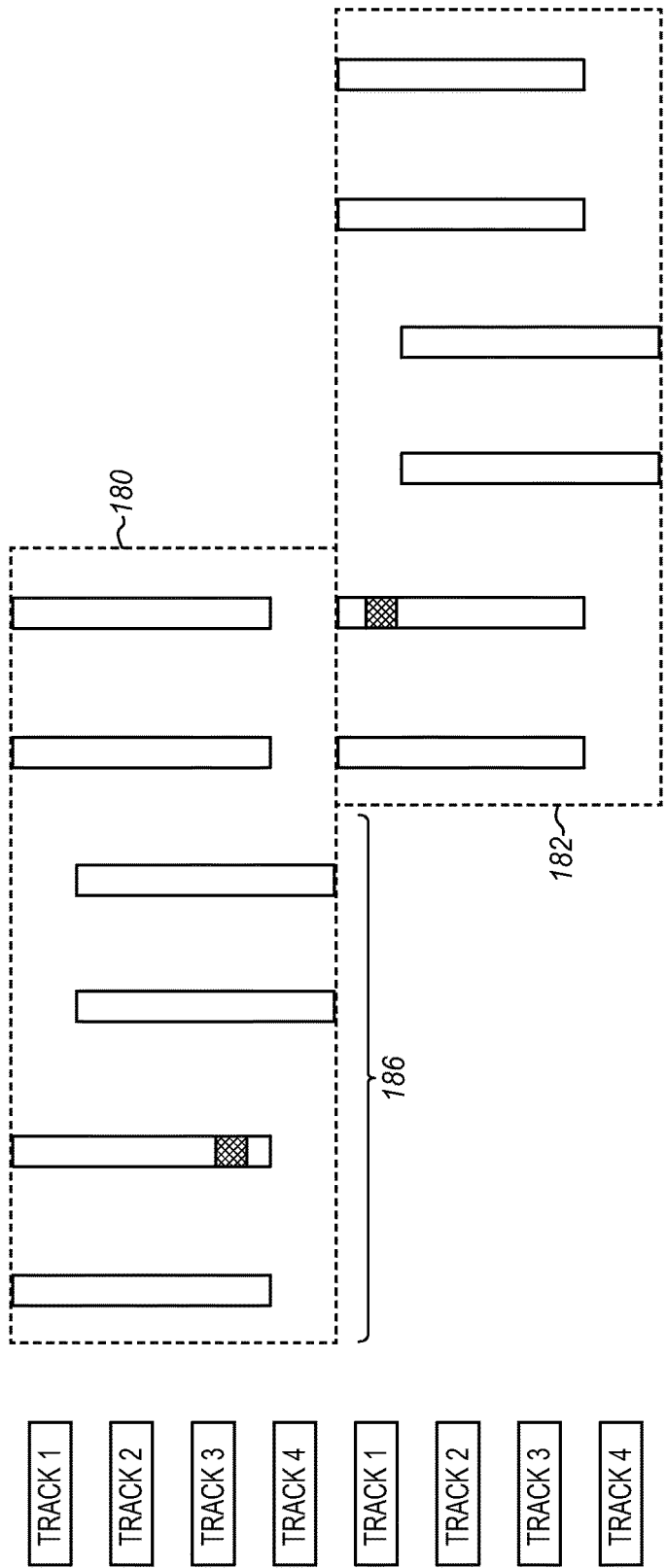
FIG. 5 is a simplified top view diagram of interconnect layers of adjacent cells of a fourth alternative integrated circuit design layout according to an embodiment.

FIG. 5 is a top view diagram of the cells of FIG. 4 in an alternative position. The same two cells 180, 182 now are positioned with a relative offset of four vertical tracks. The fifth metal line of the first cell is aligned with the first metal line of the second cell. Due to the repeating pair-wise pattern, these cells allow for an offset of any even number of pairs. The minimum edge-to-edge distance is still maintained.

FIG. 6 is a top view diagram of alternative cells in an alternative layout. In this example instead of a single alternation pattern or a pair-wise alternation, the pattern is in triplets. There are three raised metal lines, then three lowered metal lines. The first cell 190 is six tracks wide so that there is only one pattern of two triplets. The second cell 192 has the same pattern. With the two cells aligned the raised left side cells maintain the minimum edge-to-edge spacing as in the example of FIG. 1. The pattern is repeated as shown by a third cell 196 to the right of the first cell and a fourth cell 198 to the right of the second cell.

Figure 7:
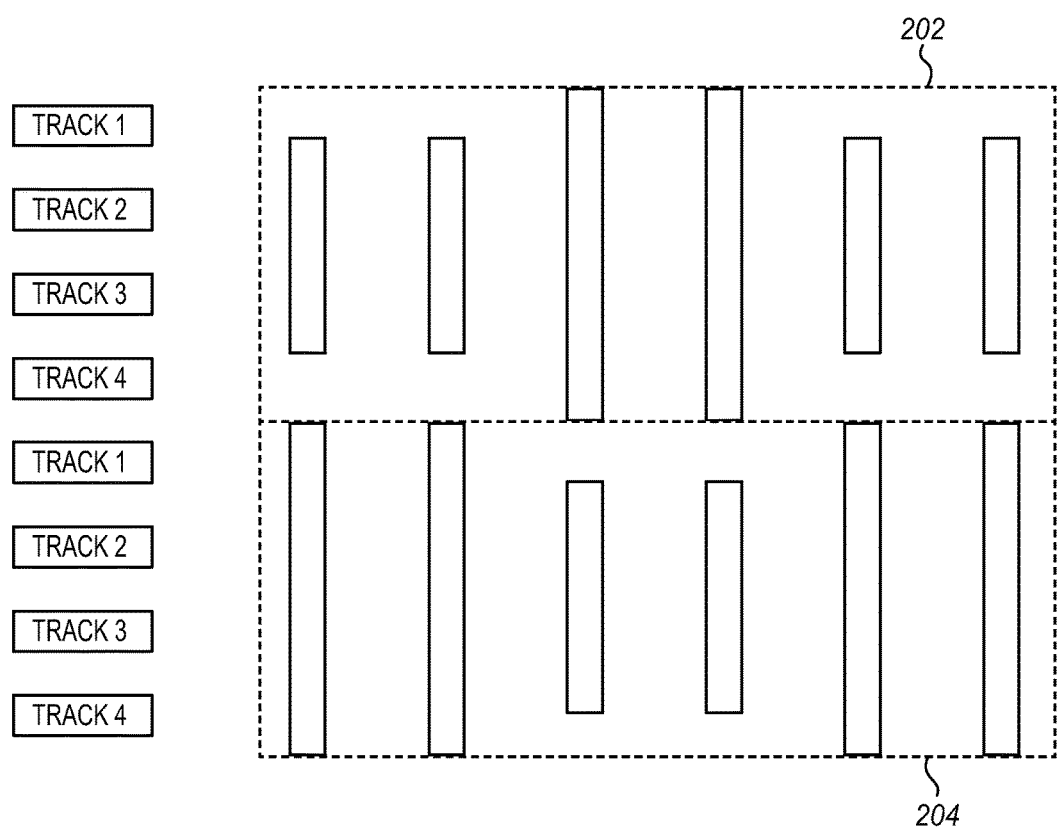
FIG. 7 is a simplified top view diagram of interconnect layers of adjacent cells of a sixth alternative integrated circuit design layout according to an embodiment.

FIG. 7 is a top view diagram of two cells with a different pair-wise repeating pattern. The first cell 202 has a pair-wise alternating pattern of two short metal lines, two metal lines, and then two more short metal lines. The short lines permit vias in the second and third horizontal tracks only. The long lines permit vias in any of the four tracks of the cell. A second cell 204 is placed below the first cell and has the inverse pattern with two long lines, followed by two short lines, followed by two more long lines. This allows the vertical tracks of the cells to be aligned while maintaining the minimum edge-to-edge distance. The cells may be made wider so that the pair-wise pattern has more repeats or shorter so that the pair-wise pattern has fewer repeats.

Figure 8:
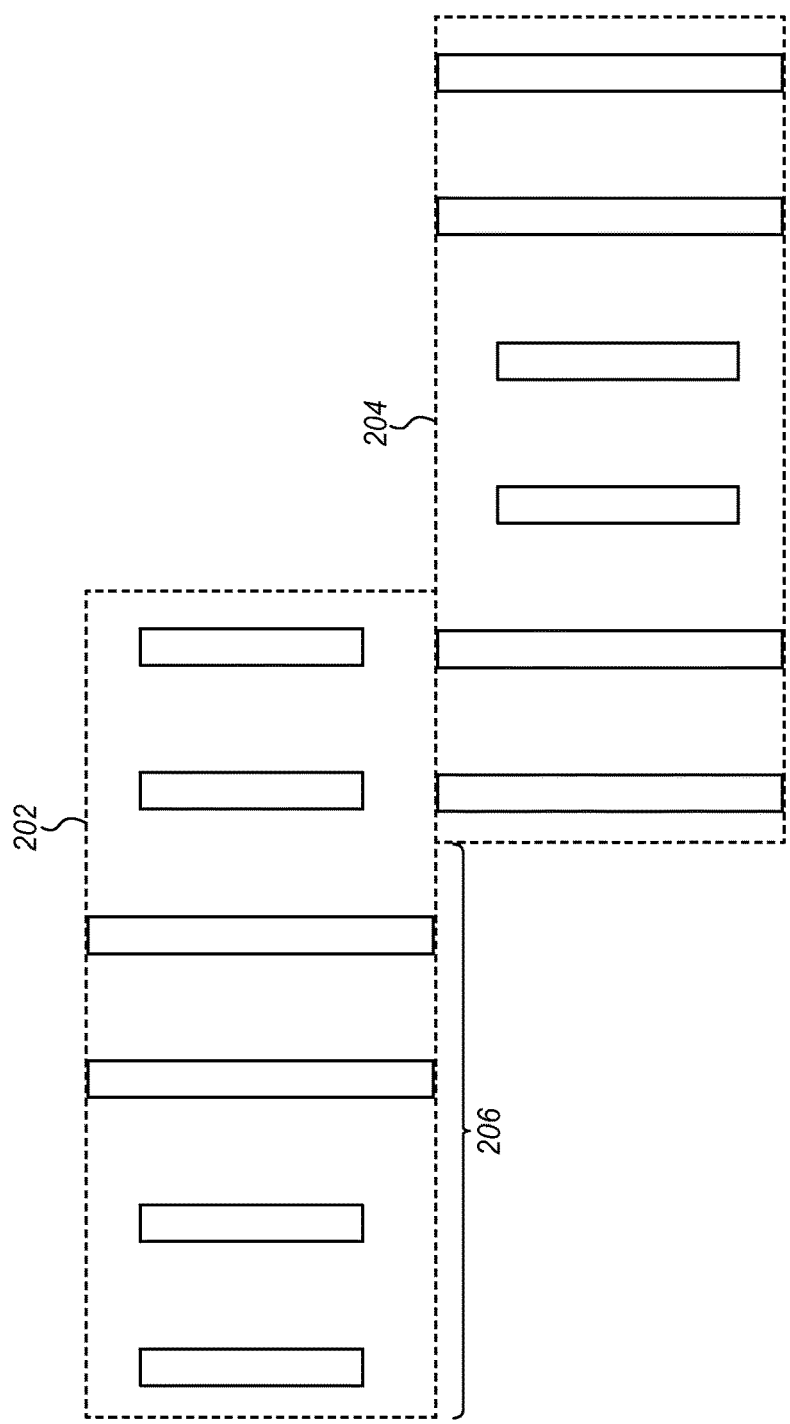
FIG. 8 is a simplified top view diagram of interconnect layers of adjacent cells of a seventh alternative integrated circuit design layout according to an embodiment.

FIG. 8 is top view diagram of the same two cells 202, 204 as in FIG. 7, but with a horizontal offset 206. The offset is equal to the width of the pattern, four tracks or two pairs of metal lines. Longer cells may also be possible in which case the pattern offset may be wider, including more tracks or more pairs. The offset maintain the alignment of the short tracks above with the long lines below and vice versa so that the minimum distance is maintained.

Figure 9:
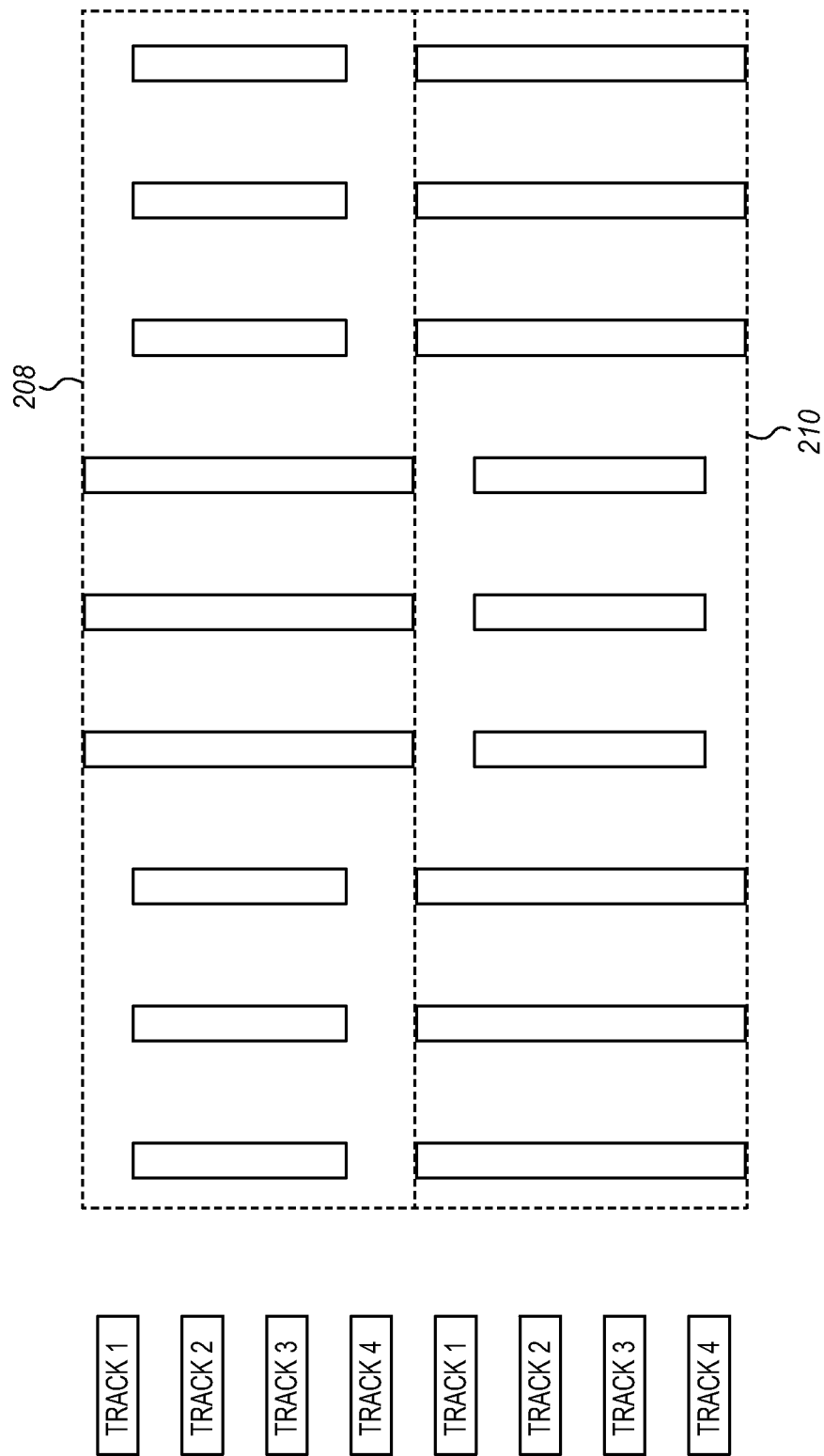
FIG. 9 is a simplified top view diagram of interconnect layers of adjacent cells of a tenth alternative integrated circuit design layout according to an embodiment.

FIG. 9 is a top view diagram of a layout with cells with a larger pattern. In this example, the short line, long line pattern is repeated with triplets instead of pairs. In a first cell, 208, there are three short lines, then three long lines, then three short lines. A second cell 210 below the first cell repeats a triplet pattern but in reverse. In this way, the vertical tracks may be aligned without violating the design rules for end-to-end distance. These two cells may also be position with an offset that is the same size as the pattern or six tracks in this example.

The patterned repeats may be extended beyond pairs and triplets. There may be four, five, six or more short bars or long bars followed by a corresponding number of long bars or short bars. The number of repeats may be adapted to suit the needs of any particular cell. As shown the same approach may also be applied to the raised bar, lowered bar patterns. There may be one, two, three, four, five or more raised bars followed by a corresponding number of lowered bars. While the patterns are shown as symmetrical, they may also be asymmetrical. That is instead of two raised bars followed by two lowered bars, there may be one raised bar followed by two lowered bars or any other asymmetrical pattern. As shown, the pattern may be repeated an even number of times such as twice as in FIG. 6 or an odd number of times such as three as in FIG. 3.

In each of these examples, by moving one or more of the metal lines vertically closer to the common boundary, the metal line is allowed access to connections on the horizontal track closest to that boundary. The vertically aligned metal line in the same track is then moved away from the common boundary. These movements are shown as vertical translations up or down or as reducing the length of one line while increasing the length of the adjacent line in the same track. While the metal lines are shown as always being as long as is permitted by the minimum end-to-end distance, this is not necessary. For some cells, a much shorter track may be sufficient to make the desired connections to the horizontal tracks. In addition, the lines may shorter or broken in some distances in order to reduce the lines to only what is needed for the desired connections.

Figure 10:
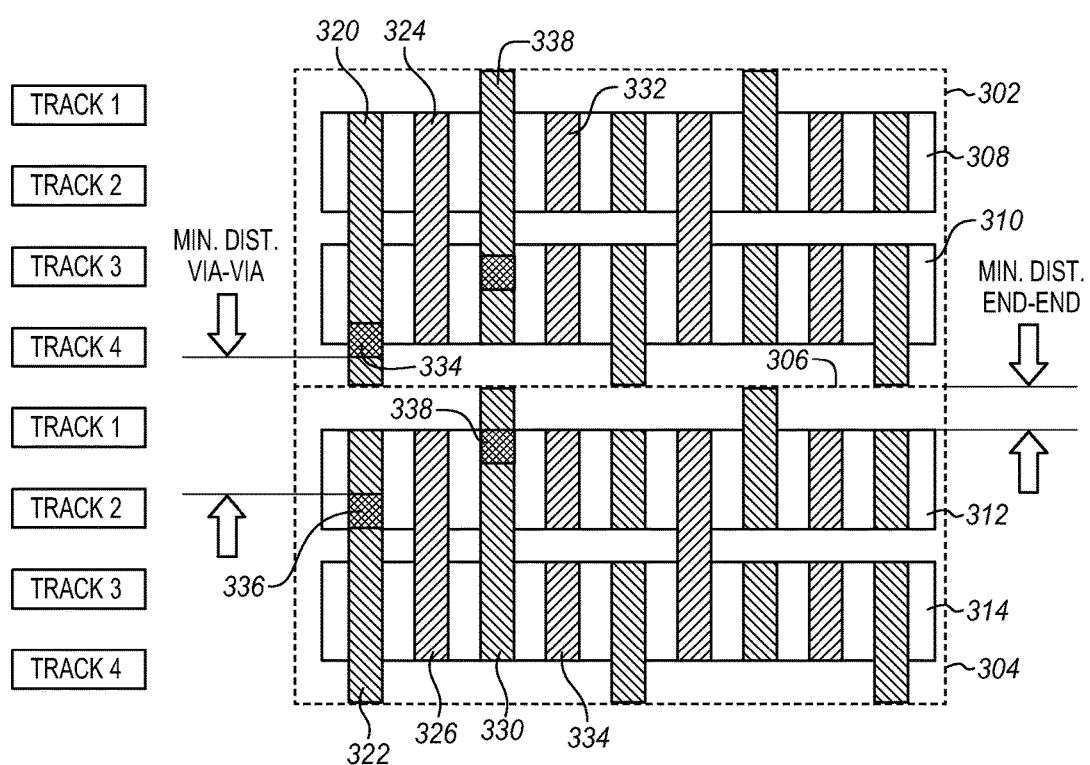
FIG. 10 is a top view diagram of interleaved metal lines of adjacent cells of an integrated circuit design layout according to an embodiment.

FIG. 10 is a top view diagram of different metal lines in a cell. Just as the interconnect layers of FIG. 1 have design rules for spacing, these metal lines also have design rules. The metal lines of FIG. 10 are interleaved with polysilicon lines in this example. A first cell 302 is aligned with and positioned adjacent to and above a second cell 304. Both cells are nine tracks wide and four tracks high, however, any other desired dimensions may be used to suit a particular implementation. The cells meet at an adjacent boundary 306 between the two cells. This boundary is the lower edge of the top cell and the upper edge of the bottom cell.

Both cells have a horizontal p-doped area 308, 312 and a horizontal n-doped area 310, 314. These areas support transistors, diodes, and any other desired devices within each cell to form the intended circuits for the cell. In the first cell the p-type area is above the n-type area and in the second cell the positions are reversed. This is simply to show that each cell may have a unique structure and configuration of elements to support the circuitry desired for the cell. This also shows that the two cells may be identical or similar except that one of the cells has been inverted and the bottom edge of the first cell corresponds to the top edge of the second cell. Depending on the particular cell, there may be only one n or p-type area. Alternatively, both areas may be n-type or p-type. There is a diffusion gap between the two diffusion areas.

The cells both have metal lines and in the illustrated example, the lines have the same position and orientation notwithstanding the different positions of the p and n-type areas. At the left of both cells, there is a metal line 320, 322 that is lowered in the cell. As a result the left metal line 320 in the first cell extends to the boundary 306 between the two cells. The left metal line 322 in the second cell is lowered so that is distanced or displaced from the boundary. This lowering of both lines allows the minimum end-to-end distance to be provided by the two adjacent vertically aligned metal lines. In the third metal lines 328, 330, the positions are reversed. The third metal line 330 of the second cell reaches the cell boundary because it is translated upwards. The third metal line 328 of the first cell is also translated upward and does not reach the cell boundary.

As described in the previous examples, this allows vias to be provided which reach the outermost horizontal tracks, track 1 and track 4, in this example, without violating the design rules. In the first cell, the first, fifth, and ninth metal lines of the top cell reach track 4 while the third and seventh lines reach track 1. The left line 334 of the first cell 302 has a via 334 that is able to connect to track 4. In the same vertical track, the left via 322 of the second cell 304 which is vertically aligned with and directly below the left via of the first cell cannot connect to track 1 but only to track 2. This is because these two vias are translated downward. The third via 330 of the second cell 304 is able to connect to track 1. The third lines are translated upward to form the alternating up and down pattern of crenellations.

The odd-numbered metal lines at this level in the transistor circuit are coupled to source and drain regions of transistors in the n and p-type areas. The metal lines allow the transistors to be connected together. Horizontal metal lines (not shown) at another level allow for additional connections to provide the desired circuit wiring. In between these metal lines, there are additional lines, the second, fourth, sixth, and eight lines between the metal lines. These lines show polysilicon connections to the gate areas. In this example, the gate lines are not crenellated like the metal lines. All of the gate lines are the same length and extend only over the n and p-type areas. None of the gate lines are able to connect to track 1 or track 4 in either cell. However, they may be connected to any other lines through another connection layer (not shown).

As a further example of adapting the metal lines to suit the circuits of the cell, the second polysilicon lines 324, 326 in both cells extend across both the n and p-type areas. The fourth polysilicon lines 332, 334 do not extend across both areas, but are broken. Each line has one segment in the n-type area and another disjoint segment in the p-type area. These two segments are not connected. This is to show that the lines in any of the example discussed herein may be broken wherever desired to support the intended circuitry for the cell.

Figure 11:
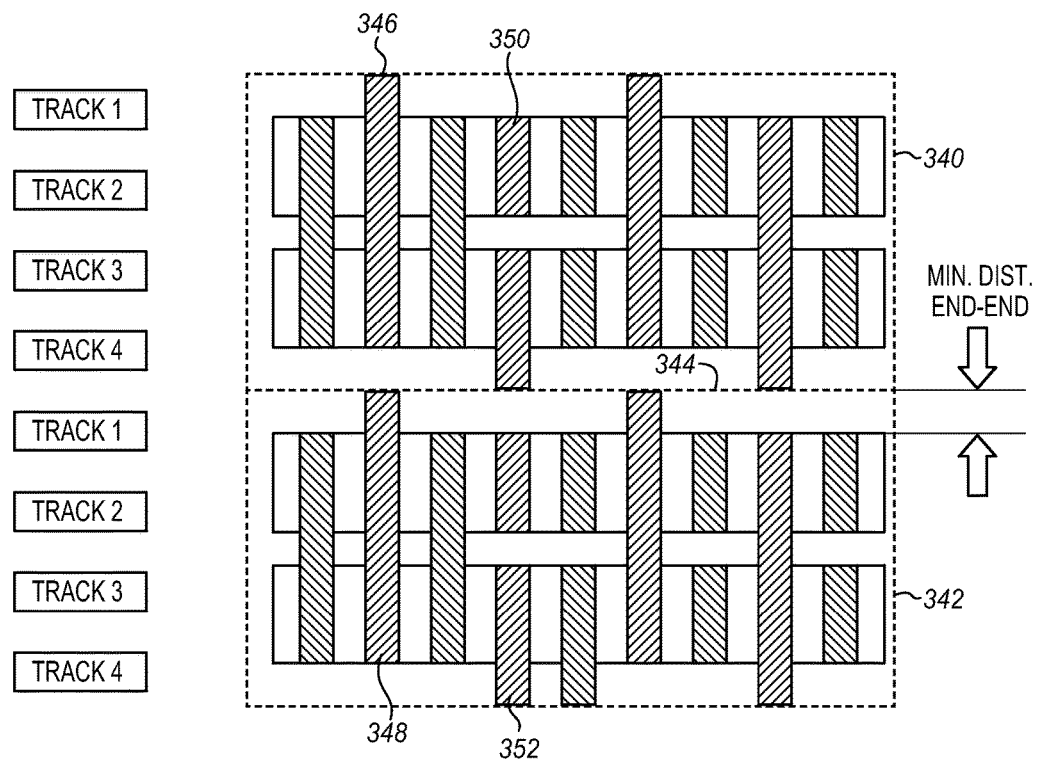
FIG. 11 is a top view diagram of interleaved metal lines of adjacent cells of another integrated circuit design layout according to an embodiment.

While the crenellations of FIG. 10 are applied only to the metal source and drain lines, crenellations may be applied to the polysilicon lines instead or in addition. FIG. 11 is a top view diagram of crenellated polysilicon lines interleaved with metal lines that are not crenellated. A first cell 340 has n and p-type areas that are connected through source and drain metal lines and with polysilicon lines. A second cell 342 is directly below and adjacent to the first cell with vertical tracks aligned. The metal lines are formed traditionally with a sufficient end-to-end distance from the both top and bottom edges of the cells.

The polysilicon lines are crenellated and alternate between being translated up and translated down. The first and left most polysilicon lines 346, 348 are translated up so that the line in the lower cell is at the edge of the cell and adjacent to the common boundary 344 but the line in the upper cell is displaced from the edge 344. The second polysilicon lines 350, 352 are translated down so that the line 350 of the first cell 340 contacts the common edge and the line 352 of the second cell 342 does not. The same advantage with respect to vias applies to this example as well.

The examples of FIGS. 10 and 11 may be modified as described above with respect to FIGS. 1-9. The lines may be crenellated singly, in pairs, in triplets and in larger groups. The cells may have more or fewer horizontal or vertical tracks. The lines may alternate between being translated up and down as shown. The lines may also alternate between being shorter and longer as in FIG. 2 and its variations. In addition, either the source/drain lines, or the polysilicon lines or both may be affected. The alternations to the lines of FIGS. 10 and 11 may be combined with the alternations of FIGS. 1-9 to provide still more flexibility in connecting the metal lines.

As shown for example in FIGS. 1, 2, and 10, by translating the positions of the lines to come closer to the edge of the cell than would be permitted, the line can connect through a via at the horizontal track that is closest to the very edge of the cell. Without moving the vertically adjacent line in the next cell away from the common boundary of the two cells, there could be no line and no via so close to the cell boundary. The design rules would prevent such a small end-to-end distance and such a small distance between vias. This may be compensated for by adding another horizontal track as a spacer, however adding another track to every cell only for spacing purposes reduces the number of cells that can be accommodated in the same area. The alternating end positions allows for connections to be made without a spacer track between cells.

In the description herein, the lines are shown as coming right to the cell boundary. This is to make the description easier to understand. In an actual system, the lines may come short of the cell boundary. In some embodiments, it may be desired only that the lines reach the last track, in the illustrated examples case track 1 or track 4. The lines may then stop after reaching those tracks so that the line ends at some distance from the edge of the cell. In other embodiments, there may be some displacement provided from the edge to ensure that the cells do not overlap or interfere with each other in use. Any of the described examples may be modified by making each of the lines a little shorter to end before the cell boundary and by breaking the lines in order to isolate different connections.

Figure 12:
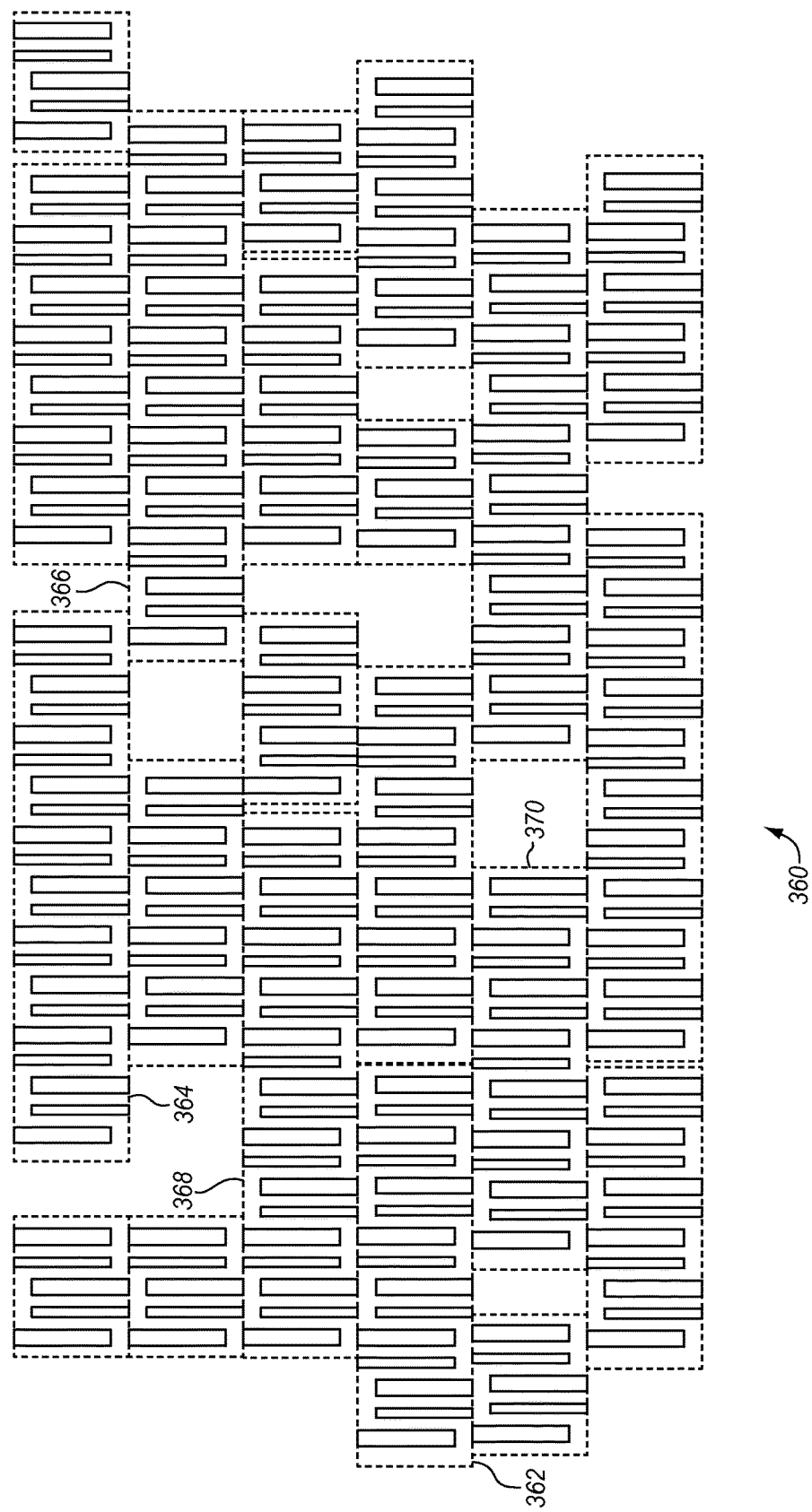
FIG. 12 is a top view diagram of a layout of multiple library cells of a part of an integrated circuit design layout according to an embodiment.

FIG. 12 is a top view diagram of a layout 360 of library cells showing one way in which many cells may be combined to form a larger layout. Only a few tens of cells are shown which may represent a simple integrated circuit. An actual integrated circuit may be about this size or may have thousands or millions of cells depending on the application. In this example, all of the cells have alternating up and down translated lines. These are interleaved at every cell boundary so that no two vertically aligned lines come too close to each other. To this end there are several places 362, 364, 366 where cells are horizontally displaced from a cell directly above or below it. The horizontal displacement may be small or large.

Many of the cells are five tracks wide. This helps in aligning the cells. On the other hand there are several larger cells being 21 tracks wide 368, 14 tracks wide 370 or another dimension with an odd or even number of tracks. Due to the consistent alternating pattern, the different widths still allow the cells to be combined together with little wasted space. The tracks all have about the same height but different heights may also be accommodated with appropriate changes to the layout 360. As suggested by the diagram, the cells may be different sizes even if there is standardized unit for size in the cell library. The cells shown in this and all of the other diagrams may correspond to transistors, to tri-gate devices, to logic gates, or to a wide range of other logic and semiconductor devices and assemblies.

FIG. 13 is a side-cross-sectional view of a portion of an integrated circuit with metal lines and polysilicon as described herein. The circuit is formed on a substrate which may be formed of silicon, glass, ceramic, gallium arsenide or any of a number of other materials. Wiring layers and passive devices 422 are formed in a base layer 406 over the substrate. The wiring layers and passive devices may be formed using metal wiring lines or using any other conductive material. The passive devices may be coupled to the conductive lines and include dielectric layers. The lower wiring layer may be used to send power or data to other layers.

A dielectric layer 408 is deposited over the lower wiring layer. Active devices 424 are formed in a doped layer over the dielectric layer. The active devices may include transistors, diodes, resistors, and other devices. The active devices may be coupled to the lower wiring layer 406 using vertical vias 430 such as through silicon vias. A dielectric layer 412 is applied over the active devices. Metal and polysilicon lines 426 are formed in a contact layer 414. These lines may correspond to the line of FIGS. 10 and 11. These lines may be directly connected to the active devices through the intervening dielectric layer.

Another dielectric layer 416 may be applied to isolate and protect the contacts of the active devices. Additional metal lines 428 may be formed in a top wiring layer 418. These metal lines may be used to connect any one or more of the devices of a cell to each other or to connect different cells to each other. There may be vias 432 from the metal lines 428 to the lower wiring layer 406 or the contacts layer 414 to connect the metal lines to other components within the cell and outside the cell. These metal lines may correspond to the metal lines of FIGS. 1-9. While these are referred to metal lines throughout, they may be formed of any of variety of different conductive materials. These materials include titanium, copper, aluminum, metal mixtures and also conductive materials other than metal.

Additional dielectric layers 420 may be formed over the metal line layer 418. Additional metal line layers may be formed over the bottom and top metal line layers. Additional electrodes, conducts, isolation, heat spreading and other layers may be formed over the top of the integrated circuit 402. The device may then be packaged, overmolded, or prepared in any other desired way depending on the intended use of the device.

Figure 14:
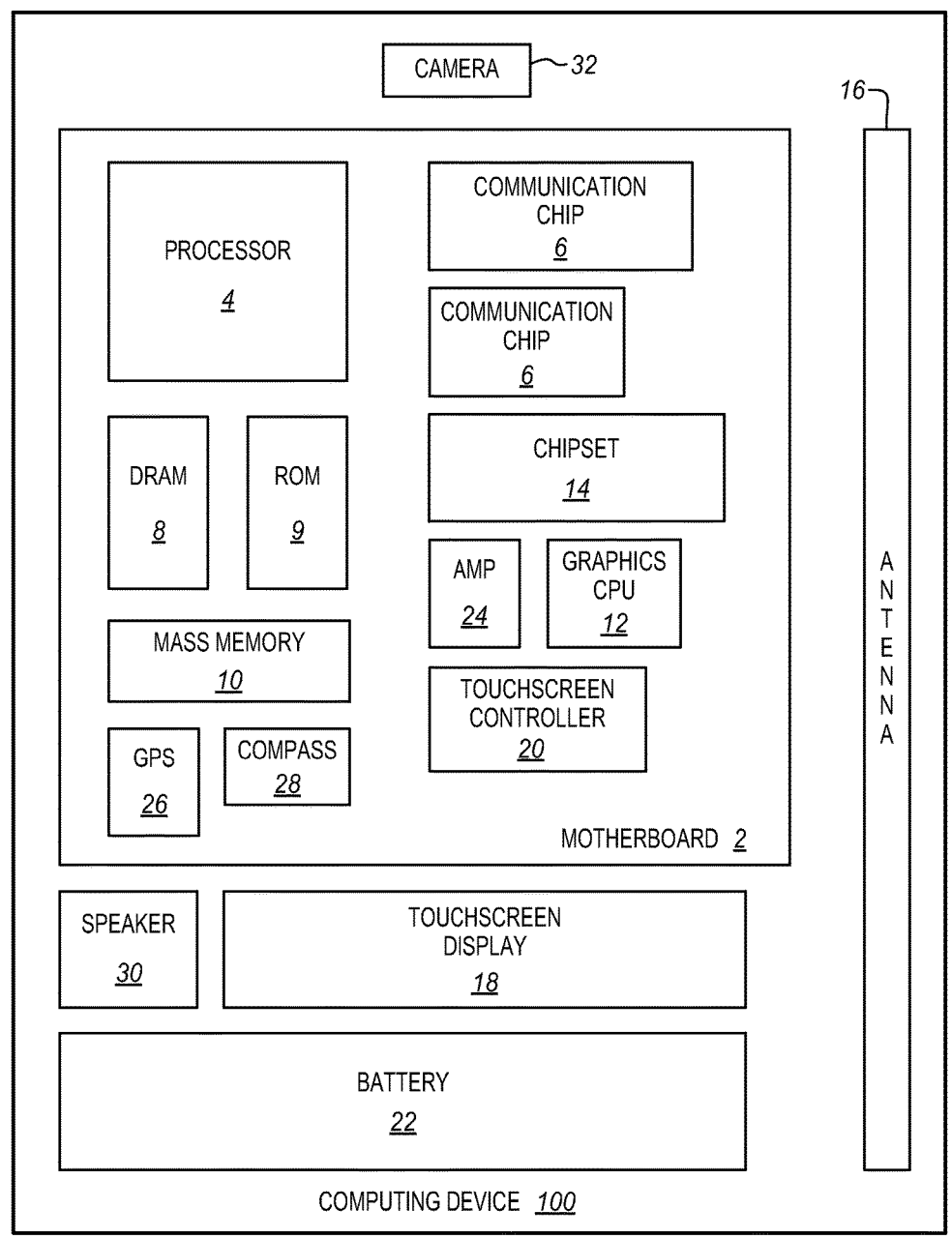
FIG. 14 is a block diagram of a computing device incorporating an integrated circuit according to an embodiment.

FIG. 14 illustrates a computing device 11 in accordance with one implementation. The computing device 11 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

The processor 4 of the computing device 11 includes an integrated circuit die packaged within the processor 4. In some implementations, the integrated circuit die of the processor, memory devices, communication devices, or other components are designed and laid out using cells from a library as described herein. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data including a wearable device.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes a first cell of an integrated circuit layout, a second cell of the integrated circuit layout, the second cell being adjacent to the first cell, a first plurality of conductive lines in the first cell, a first portion of the first plurality having line ends that are a first distance from the second cell, and a second plurality of conductive lines in the second cell, the conductive lines being parallel to and vertically aligned with the conductive lines in the first cell, a second portion of the second plurality having line ends that are a second distance from the first cell, wherein the first distance is shorter than the second distance.

In further embodiments lines of the first portion comprise alternating conductive lines of the first plurality.

In further embodiments wherein lines of a second portion of the first plurality of lines have a third distance from the second cell that is greater than the first distance, wherein lines of a second portion of the second plurality of conductive lines have a fourth distance from the first cell that is less than the second distance, and wherein lines of the second portion of the first plurality are aligned with lines of the second portion of the second plurality.

In further embodiments lines of the first portion comprise even-numbered ones of the first plurality.

In further embodiments the first plurality of conductive lines comprise a sequence of conductive lines from left to right vertically aligned with vertical tracks and wherein lines of the first portion comprises the first and second conductive lines and the fifth and sixth conductive lines.

In further embodiments lines of the first portion of conductive lines are longer than conductive lines of the first plurality that are not in the first portion.

In further embodiments the first distance and the second distance combined is greater than a minimum end-to-end distance design rule for the integrated circuit.

In further embodiments the conductive lines are in a wiring layer of the integrated circuit.

In further embodiments the conductive lines are polysilicon gate wiring in a contacts layer of the integrated circuit.

In further embodiments the conductive lines are source and drain wiring in a contacts layer of the integrated circuit.

In further embodiments the second cell has an edge that is adjacent to an edge of the first cell along a shared boundary.

In further embodiments the conductive lines of the first plurality are crenellated with respect to an edge of the first cell.

Some embodiments pertain to a method that includes placing a first cell into an integrated circuit layout, the first cell having a first plurality of parallel conductive lines, including a first portion of the first plurality of conductive lines that are closer to an edge of the cell than other lines of the first plurality, and placing a second cell of the integrated circuit layout adjacent to the edge of the first cell, the second cell having a second plurality of parallel conductive lines, a second portion of the second plurality having line ends that are farther from the edge of the first cell than other lines of the second plurality, the placing so that the second portion of the second plurality of conductive lines are aligned end-to-end with the first portion of the first plurality of conductive lines.

In further embodiments the first and second cells are defined using vertical tracks and wherein lines of the first plurality of lines are each in a different parallel vertical track.

In further embodiments lines of the first portion comprise alternating conductive lines of the first plurality.

In further embodiments lines of the first portion comprise every other conductive line of the first plurality.

In further embodiments the first plurality of conductive lines comprise a sequence of conductive lines from left to right and wherein lines of the first portion comprise the first and second conductive lines and the fifth and sixth conductive lines.

In further embodiments lines of the first portion of conductive lines are longer than conductive lines of the first plurality that are not in the first portion.

In further embodiments the other lines of the first plurality of lines are aligned end-to-end with the other lines of the second plurality of lines.

In further embodiments the first and second cells are defined using vertical tracks and the placing being so that the lines of the first portion are in different vertical tracks from the lines of the second portion.

Some embodiments pertain to a system that includes a system board, a memory connected to the system board, and a processor connect to the system board and coupled to the memory through the system board, the processor having a layout formed of multiple cells including a first and a second cell adjacent to the first cell, the layout including a first plurality of conductive lines in the first cell, lines of a first portion of the first plurality having line ends that are a first distance from the second cell, and a second plurality of conductive lines in the second cell, the conductive lines being parallel to and vertically aligned with the conductive lines in the first cell, a second portion of the second plurality having line ends that are a second distance from the first cell, wherein the first distance is shorter than the second distance.

In further embodiments lines of the first portion comprise alternating conductive lines of the first plurality.

In further embodiments the second cell has an edge that is adjacent to an edge of the first cell along a shared boundary and the conductive lines are vertically aligned in parallel tracks.

The invention claimed is:

1. An apparatus comprising:
   a first cell of an integrated circuit layout of an integrated circuit;
   a second cell of the integrated circuit layout, the second cell being adjacent to and below the first cell;
   a first plurality of conductive lines in the first cell, conductive lines of a first portion of the first plurality of conductive lines having line ends that are at a location which is a first distance away from the second cell, wherein the conductive lines of the first portion comprise alternating conductive lines of the first plurality of conductive lines; and
   a second plurality of conductive lines in the second cell, the second plurality of conductive lines being parallel to and vertically aligned with the first plurality of conductive lines in the first cell, a second portion of the second plurality of conductive lines having line ends that are at a location which is a second distance away from the first cell, wherein the first distance is shorter than the second distance, wherein the conductive lines of the second portion comprise alternating conductive lines of the second plurality of conductive lines.

2. The apparatus of claim 1, wherein the conductive lines of the first portion comprise every other conductive lines of the first plurality of conductive lines.

3. The apparatus of claim 1, wherein the conductive lines of the first portion comprise even-numbered conductive lines of the first plurality of conductive lines.

4. The apparatus of claim 1, wherein the first plurality of conductive lines comprise a sequence of conductive lines from left to right vertically aligned with vertical tracks and wherein lines of the first portion comprises a first conductive line and a second conductive line and a fifth conductive lines and a sixth conductive line.

5. The apparatus of claim 1, wherein the conductive lines of the first portion of conductive lines are longer than conductive lines of the first plurality of conductive lines that are not in the first portion.

6. The apparatus of claim 1, wherein the first distance and the second distance combined is greater than a minimum end-to-end distance design rule for the integrated circuit.

7. The apparatus of claim 1, wherein the conductive lines are in a wiring layer of the integrated circuit.

8. The apparatus of claim 1, wherein the conductive lines are polysilicon gate wirings in a contacts layer of the integrated circuit.

9. The apparatus of claim 1, wherein the conductive lines are a source wiring and a drain wiring in a contact layer of the integrated circuit.

10. The apparatus of claim 1, wherein the second cell has a top edge that is adjacent to a bottom edge of the first cell along a shared boundary.

11. The apparatus of claim 1, wherein the conductive lines are vertically aligned in parallel tracks.

12. A method comprising:
placing a first cell into an integrated circuit layout, the first cell having a first plurality of parallel conductive lines, including a first portion of the first plurality of parallel conductive lines that are closer to a bottom edge of the first cell than other lines of the first plurality of parallel conductive lines, wherein the parallel conductive lines of the first portion comprise alternating parallel conductive lines of the first plurality of parallel conductive lines; and
placing a second cell of the integrated circuit layout adjacent to the bottom edge of the first cell, the second cell having a second plurality of parallel conductive lines, a second portion of the second plurality of parallel conductive lines having line ends that are farther from the bottom edge of the first cell than other lines of the first plurality of parallel conductive lines, the placing so that the second plurality of parallel conductive lines are vertically aligned with the first plurality of parallel conductive lines, and the first portion of the first plurality of parallel conductive lines are in a horizontal offset from the second portion of the second plurality of parallel conductive lines, wherein the parallel conductive lines of the second portion comprise alternating parallel conductive lines of the second plurality of parallel conductive lines.

13. The method of claim 12 wherein the parallel conductive lines of the first plurality of parallel conductive lines lines are each in a different parallel vertical track and wherein the horizontal offset corresponds to one vertical track.

14. The method of claim 12, wherein the parallel conductive lines of the first portion comprise every other parallel conductive lines of the first plurality of parallel conductive lines.

15. The method of claim 12, wherein the first plurality of parallel conductive lines comprise a sequence of parallel conductive lines from left to right vertically aligned with vertical tracks and wherein the parallel conductive lines of the first portion comprise a first conducive line and a second conductive line and a fifth conductive line and a sixth conductive line.

16. A system comprising:
a system board;
a memory connected to the system board; and
a processor connect to the system board and coupled to the memory through the system board, the processor having a layout formed of multiple cells including a first cell and a second cell adjacent to and below the first cell, the layout including:
a first plurality of conductive lines in the first cell, conductive lines of a first portion of the first plurality of conductive lines having line ends that are at a location which is a first distance away from the second cell, wherein the conductive lines of the first portion comprise alternating conductive lines of the first plurality of conductive lines; and
a second plurality of conductive lines in the second cell, the conductive lines in the second cell being parallel to and vertically aligned with the conductive lines in the first cell, a second portion of the second plurality of conductive lines having line ends that are at a location which is a second distance away from the first cell, wherein the first distance is shorter than the second distance, wherein the conductive lines of the second portion comprise alternating conductive lines of the second plurality of conductive lines.

17. The system of claim 16, wherein the second cell has a top edge that is adjacent to a bottom edge of the first cell along a shared boundary and the conductive lines in the first and second cells are vertically aligned in parallel tracks.

* * * * *